(12) United States Patent
Holl et al.

(10) Patent No.: US 6,652,805 B2
(45) Date of Patent: Nov. 25, 2003

(54) HIGHLY FILLED COMPOSITES OF POWDERED FILLERS AND POLYMER MATRIX

(75) Inventors: Richard A. Holl, Camarillo, CA (US); Philip L. Lichtenberger, Thousand Oaks, CA (US); Kenneth S. Yao, San Gabriel, CA (US)

(73) Assignee: Holl Technologies Company, Camarillo, CA (US)

( * ) Notice: Subject to any disclaimer, the term of this patent is extended or adjusted under 35 U.S.C. 154(b) by 0 days.

(21) Appl. No.: 09/973,347

(22) Filed: Oct. 5, 2001

(65) Prior Publication Data

US 2002/0078793 A1 Jun. 27, 2002

Related U.S. Application Data

(63) Continuation-in-part of application No. 09/345,813, filed on Jul. 2, 1999, now Pat. No. 6,391,082.

(51) Int. Cl.[7] .................................................. B22F 3/00
(52) U.S. Cl. ................... 419/10; 419/3; 419/5; 419/30; 264/122; 264/204
(58) Field of Search .................. 419/3, 5, 30; 75/230; 428/548; 148/300; 252/62.54, 62.55; 264/122, 204

(56) References Cited

U.S. PATENT DOCUMENTS

| | | | |
|---|---|---|---|
| 4,251,576 A | * | 2/1981 | Osborn et al. ............... 428/331 |
| 4,287,075 A | | 9/1981 | Fujiwara et al. |
| 4,335,180 A | | 6/1982 | Traut |
| 4,889,909 A | | 12/1989 | Besecke et al. |
| 5,154,973 A | | 10/1992 | Imagawa et al. |
| 5,198,137 A | | 3/1993 | Rutz et al. |
| 5,204,416 A | | 4/1993 | Mercer et al. |
| 5,212,278 A | | 5/1993 | Pfaendner |
| 5,268,140 A | | 12/1993 | Rutz et al. |
| 5,358,775 A | | 10/1994 | Horn, III |
| 5,391,603 A | | 2/1995 | Wessel et al. |
| 5,395,914 A | | 3/1995 | Wilharm et al. |
| 5,449,652 A | | 9/1995 | Swartz et al. |
| 5,506,049 A | | 4/1996 | Swei et al. |
| 5,552,210 A | | 9/1996 | Horn, III et al. |
| 5,658,485 A | | 8/1997 | Cava et al. |
| 5,659,006 A | | 8/1997 | White |
| 5,693,742 A | | 12/1997 | White et al. |
| 5,739,193 A | | 4/1998 | Walpita et al. |
| 5,754,936 A | | 5/1998 | Jansson |
| 5,874,516 A | | 2/1999 | Burgoyne, Jr. et al. ..... 528/219 |
| 5,929,138 A | | 7/1999 | Mercer et al. |
| 5,998,533 A | | 12/1999 | Weber et al. |
| 6,039,784 A | | 3/2000 | Luk |
| 6,074,472 A | | 6/2000 | Jachow et al. |
| 6,093,636 A | | 7/2000 | Carter et al. |
| 6,143,052 A | | 11/2000 | Kijokawa et al. |

FOREIGN PATENT DOCUMENTS

| JP | 11322920 A2 | 11/1999 |
|---|---|---|
| WO | WO 97 42639 | 11/1997 |

* cited by examiner

*Primary Examiner*—Ngoclan Mai
(74) *Attorney, Agent, or Firm*—Christopher Darrow; Claude Nassif; Greenberg Traurig, LLP

(57) ABSTRACT

Highly filled composite materials, e.g. comprising approximately 60 volume % or greater of finely powdered particles of filler in a polymer matrix, are made by dissolving polymer in a volatilisable solvent, adding filler and forming a homogeneous mixture by high shear mixing. Most solvent is then removed while maintaining homogeneity in the mixture, preferably by evaporation in a high shear mill. Then, extruding a thin layer of the composite material and removing remaining solvent, as by heating. Bodies are formed from the dried layer, which are heated and pressed to melt and disperse melted polymer into the interstices between filler particles. Thereby, certain polymers unusable at low solids contents become effective bonding materials at high solids contents. Filler materials are chosen to tailor electrical and physical properties of the articles, which may comprise substrates for electronic circuits. Suitable polymers are certain polyarylene ethers soluble in cyclohexanone.

12 Claims, 3 Drawing Sheets

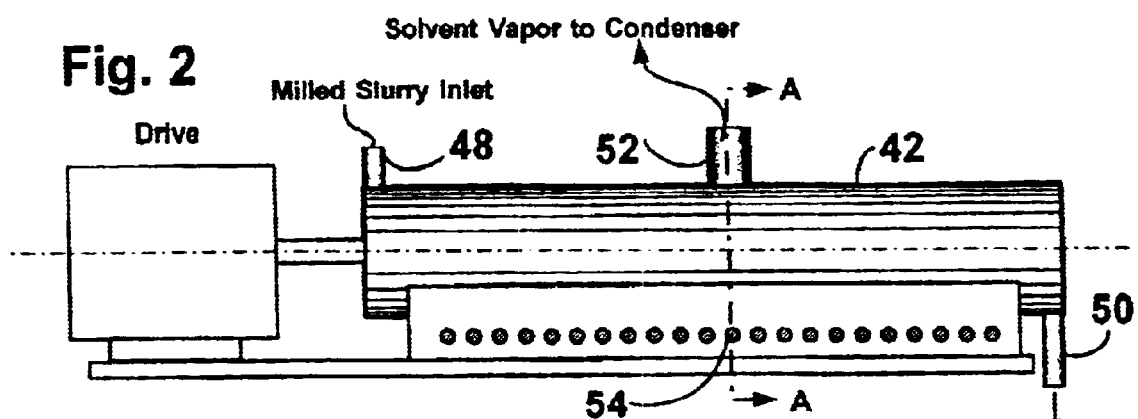
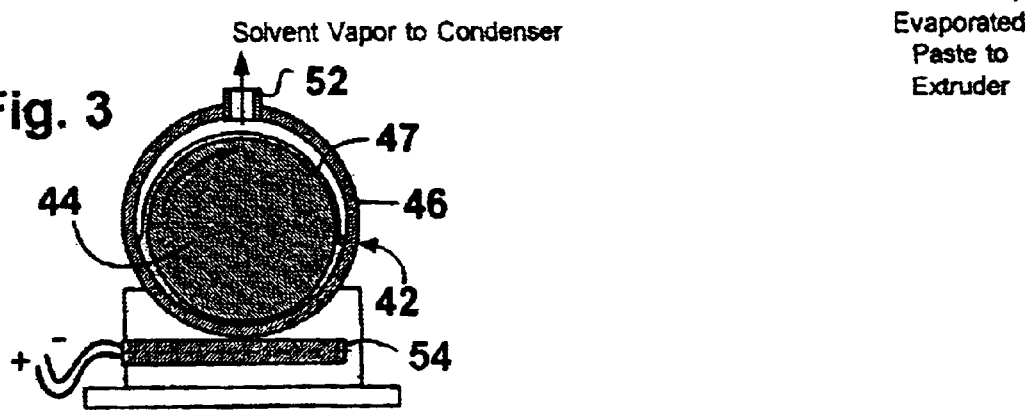
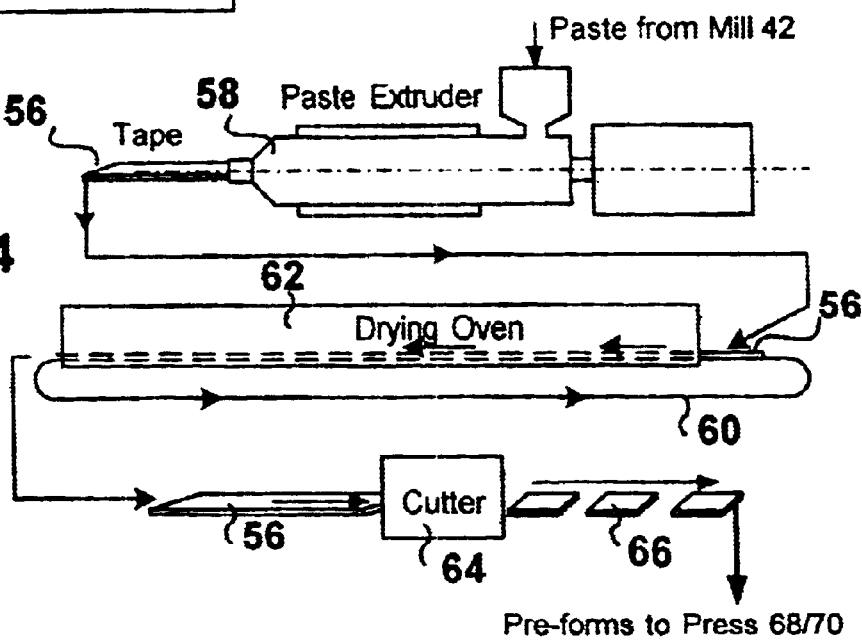

HIGHLY FILLED COMPOSITES OF POWDERED FILLERS AND POLYMER MATRIX

CROSS-REFERENCE TO A RELATED APPLICATION

This application is a continuation-in-part of my prior application Ser. No. 09/345,813, filed Jul. 2, 1999 now U.S. Pat. No. 6,391,082.

BACKGROUND OF THE INVENTION

1. Field of the Invention

The invention is concerned with methods for the manufacture of highly filled composite materials consisting of finely powdered filler material in a matrix of polymer material, and new highly filled composite materials made by such methods.

2. General Background and State of the Art

The electronics industry is an example of one which makes substantial use of substrates as supports and dielectric participants for electronic circuits, such substrates consisting of thin flat pieces produced to exacting specifications as to starting material and physical and electrical properties. The history of the industry shows the use of progressively higher operating frequencies and currently for frequencies up to about 800 megahertz (MHz) copper coated circuit boards of glass fiber reinforced polymers, such as epoxies, cyanide esters, polytetrafluoroethylene (PTFE) and polyimides, have been and are still used. One popular laminate material for such applications is known as FR-4, consisting of epoxy resin deposited on a woven glass fabric, because of its ease of manufacture and low cost. Typically this material has a dielectric constant of 4.3–4.6 and a dissipation factor of 0.016–0.022 and is frequently used in computer related applications employing frequencies below about 500 MHz. The lowest possible value of dielectric constant is preferred in computer applications to improve signal speed. Some computers now operate at 2.0 GHz, while mobile telephones now operate at frequencies of 1–40 GHz, with the prospect of higher frequencies in the future. At higher operating frequencies above approximately 0.8 GHz, FR-4 and similar materials, despite their low cost, are no longer entirely suitable, primarily because of unacceptable dielectric losses, excessive heating, lack of sufficient uniformity, unacceptable anisotropy, unacceptable mismatch of thermal expansion between the dielectric material and its metallization, and anisotropic thermal expansion problems as the operating temperatures of the substrates fluctuate. These thermal expansion problems result from the relatively large coefficients of thermal expansion of the polymers used as substrate material, and the unequal expansion coefficients of reinforcing fibers in their length and thickness dimensions. For frequencies above 800 MHz the dielectric material of the substrates becomes an active capacitive participant in signal propagation and here the current materials of choice are certain ceramics formed by sintering or firing suitable powdered inorganic materials, such as fused silica; alumina; aluminum nitride; boron nitride; barium titanate; barium titanate complexes such as $Ba(Mg_{1/3}Ti_{2/3})O_2$, $Ba(Zr,Sn)TiO_4$, and $BaTiO_3$ doped with $Sc_2O_3$ and rare earth oxides; alkoxide-derived $SrZrO_3$ and $SrTiO_3$; and pyrochlore structured $Ba(Zr,Nb)$ oxides. Substrates have also been employed consisting of metal and semiconductor powders embedded in a glass or polymer matrix, a particular preferred family of polymers being those based on PTFE.

For example, ceramic substrates that have been used for hybrid electronic circuit applications comprise square plates of 5 cm (2 ins) side, their production usually involving the preparation of a slurry of the finely powdered materials dispersed in a liquid vehicle, dewatering the slip to a stiff leathery mixture, making a "green" preform from the mixture, and then sintering the preform to become the final substrate plate. The substrates are required to have highly uniform values of thickness, grain size, grain structure, density, surface flatness and surface finish, with the purpose of obtaining substantially uniform dielectric, thermal and chemical properties, and also to permit the substantially uniform application to the surfaces of fine lines of conductive or resistive metals or inks.

Such sintered products inherently contain a number of special and very characteristic types of flaws. A first consists of fine holes created by the entrainment of bubbles in the ceramic pre-casting slip of sizes in the range about 1–20 micrometers; these bubbles cannot be removed from the slip by known methods and cause residual porosity in the body. As an example, sintered alumina substrates may have as many as 800 residual bubble holes per sq/cm of surface (5,000 per sq/in). Another flaw is triple-point holes at the junctions of the ceramic granules when the substrate has been formed by roll-compacting of spray-dried powder; they are of similar size to the bubble holes and appear in similar numbers per sq/cm. Yet another consists of "knit-lines", which are webs or networks of seam lines of lower density formed at the contact areas between butting particles during cold pressing. Two other common flaws are caused by inclusions of foreign matter into the material during processing, and the enlarged grains caused by agglomeration of the particles despite their initial fine grinding. The usual inclusions are fine particles due to abrasive wear of the grinding media in the mills. Both inclusions and agglomerates will sinter in a matrix at a different rate from the remainder of the matrix and can result in flaws of much greater magnitude than the original inclusion or agglomerate.

Costly mirror-finishing by diamond machining and lapping of the ceramic surfaces is required to allow the accurate deposition of sputtered metallization layers from which conductor lines are formed by etching. Mirror-finishes are required because the electrical currents at frequencies above 0.8 GHz move predominantly in the skin of a conductor line, while in the lower frequencies they occupy the entire cross-section. The thickness of the skin through which currents move at GHz frequencies becomes thinner as frequencies rise and are already as thin as 1 to 2 micrometers in copper at around 2 GHz. Any surface roughness of the conductors will therefore contribute to conductive losses. For example, at a frequency of 4 GHz, the conductive loss at of the interface between conductor and substrate is 1.65 times higher with an RMS roughness of 40, compared to an RMS roughness of 5 (See P.42 of Materials and Processes for Microwave Hybrids, R. Brown, published 1989 by the International Society for Hybrid Microelectronics of Reston, Va.)

There is therefore continuing interest in methods for manufacturing composite materials for the production of electronic substrates and for use as electronic packaging materials, with which sintering and the high processing temperatures required together with their attendant difficulties, high cost of diamond machining and lapping, and the associated considerable costs are avoided.

The low inherent mechanical strength of the currently available matrix forming polymers and their excessive thermal expansion coefficients has made it necessary to embed reinforcing materials, such as woven glass fiber cloth, into the substrate body, to strengthen it and also to constrain this excessive thermal expansion. But such reinforcing materials unfortunately cause unacceptable inhomogeneity of the structure. For example, their presence makes it difficult to incorporate powdered filler materials into the body of the substrate with a high degree of uniformity. Another difficulty is caused by the generally poor adhesion exhibited by the commercially available matrix polymers toward the usual filler materials, and extensive research and development has been undertaken in the past, and is continuing, in connection with known substrate-forming polymers, such as PTFE, to find coupling agents that will provide adequate adhesion between the polymer and the powder components, and thus satisfactory mechanical strength in the resultant substrates.

Dielectric materials are commonly used as insulating layers between circuits, and layers of circuits in multilayer integrated circuits, the most commonly used of which is silica, which in its various modifications has dielectric constants of the order of 3.0–5.0, more usually 4.0–4.5. Low values of dielectric constant are preferred and organic polymers inherently usually have low dielectric values in the range 1.9–3.5, so that considerable research and work has been done to try to develop polymers suitable for this special purpose, among which are polyimides (frequently fluorinated), PTFE, and fluorinated polyarylene ethers, some of the materials having dielectric constants as low as that of air, i.e. 1.00.

U.S. Pat. Nos. 5,658,994, issued Aug. 19, 1997, and 5,874,516, issued Feb. 23, 1999, both to Air Products and Chemicals, Inc. of Allentown, Pa, the disclosures of which are incorporated herein by this reference, disclose and claim a unique utility as a dielectric coating material for microelectronic devices of a class of polyarylene ethers as a replacement for silica-based dielectric materials, wherein the polyarylene ether does not have non-aromatic carbons (other than perphenylated carbon), fluorinated substituents or significantly polarizable functional groups. These materials, which are relatively easily synthesized, are found surprisingly to have an excellent combination of desirable properties, namely thermal stability, low dielectric constant values, low moisture absorption and low moisture out gassing.

U.S. Pat. No. 5,658,994 discloses and claims in its broadest aspect an article of manufacture comprising a combination of a dielectric material and a microelectronic device, wherein the dielectric material is provided on the microelectronic device and contains a polyarylene ether polymer consisting essentially of non-functional repeating units of the structure:

wherein m=0 to 1.0; and n=1.0-m; and $Ar_1$, $Ar_2$, $Ar_3$ and $Ar_4$ are individually divalent arylene radicals selected from the group consisting of: phenylene; biphenyl diradical; para-terphenyl diradical; meta-terphenyl diradical; ortho-terphenyl diradical; naphthalene diradical; anthracene diradical; phenanthrene diradical; diradicals of 9,9-diphenylfluorene of specific type; and 4,4'-diradical of dibenzofuran and mixtures thereof, but $Ar_1$, $Ar_2$, $Ar_3$, and $Ar_4$, other than the diradical 9,9-diphenylfluorene, are not isomeric equivalents.

U.S. Pat. No. 5,874,516 claims polyarylene ethers consisting essentially of non-functional repeating units of the structure:

wherein m=0.2 to 1.0; and n=1.0-m; and $Ar_1$, $Ar_2$, and $Ar_3$ are individually divalent radicals selected from the group defined in the preceding paragraph; or essentially of non-functional repeating units of the structure:

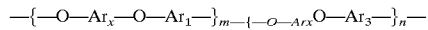

wherein m=0 to 1.0; and n=1.0-m; $Ar_x$ is a special radical 9,9-bis(4-oxyphenyl)fluorene and $Ar_1$ and $Ar_3$ are individually divalent radicals also selected from the group defined in the immediately preceding paragraph. Variations in $Ar_1$, $Ar_2$, $Ar_3$ and $Ar_4$ are stated to allow access to a variety of properties such as reduction or elimination of crystallinity, modulus, tensile strength, high glass transition temperature, etc. The polymers are said to be essentially chemically inert, have low polarity, have no additional functional or reactive groups, and to be thermally stable at temperatures of 400°–450° C. in inert atmospheres.

The specified polymers are non-functional in that they are chemically inert and they do not bear any functional groups that are detrimental to their application in the fabrication of microelectronic devices. They do not have carbonyl moieties such as amide, imide and ketone, which promote adsorption of water. They do not bear halogens such as fluorine, chlorine, bromine and iodine, which can react with metal sources in metal deposition processes. They are composed essentially of aromatic carbons, except for the bridging carbon in the 9,9-fluorenylidene group, which has much of the character of aromatic carbons due to its proximity to aromatic structures; for the purposes of the invention the carbon is deemed to be a perphenylated carbon.

The polymers are proposed for use as coatings, layers, encapsulants, barrier regions or barrier layers or substrates in microelectronic devices. These devices may include, but are not limited to multichip modules, integrated circuits, conductive layers in integrated circuits, conductors in circuit patterns of an integrated circuit, circuit boards as well as similar or analogous electronic structures requiring insulating or dielectric regions or layers. They are also proposed for use as a substrate (dielectric material) in circuit boards or printed wiring boards. Such a circuit board has mounted on its surface patterns for various electrical conductor circuits, and may include various reinforcements, such as woven nonconducting fibers, such as glass cloth. Such circuit boards may be single-sided, double-sided or multilayered.

Although the above discussion of prior art proposals for filled polymer substrates has referred almost entirely to the support substrates used in the electronics industry there are many other products in which such filled materials are used, and in which the highest possible filling with the filler material is of advantage. Examples are magnets, ferrite antennae, resistors and capacitors.

DISCLOSURE OF THE INVENTION

The principal object of the invention is to provide new methods for manufacturing highly-filled composite materials consisting of particles of finely powdered filler material bonded together in a matrix of polymer material, such new composite materials, and articles made from such composite materials.

It is another object to provide such new methods with which the resultant composite materials and articles comprise at least 60 percent by volume of filler material, with the remainder consisting of the polymer material matrix together with the residue of any additives employed in their production.

It is a further object to provide such new methods which are operable to produce composite materials and articles comprising at least 60 percent by volume of the filler material, with the remainder consisting essentially of the polymer material matrix, employing as the polymer material polymers soluble in a volatilisable solvent and adequately adhesive to the filler material to provide a minimum flexural strength in the resultant composites.

In accordance with the invention there are provided methods for the production of highly filled composites of finely powdered filler material particles in a polymer matrix comprising the steps of:

forming a solution of polymer in volatilizable solvent, the polymer being of sufficient strength and sufficiently adhesive to the filler material particles to result in composites of flexural strength not less than 17 Mpa (2,500 psi);

mixing together from 60 to 97 by volume percent of filler material particles with sufficient solution to form a suspension having therein the balance in volume percent of the polymer required for the composite;

evaporating solvent from the suspension while subjecting it to high shear treatment so as to maintain distribution of filler particles in the solution with a high degree of uniformity, the evaporation being continued until a mixture is obtained consisting essentially of filler particles with the residual solution distributed with a high degree of uniformity therein, the evaporation being further continued until the solvent has substantially entirely been removed; and subjecting the mixture to a temperature sufficient to melt the polymer and to a pressure sufficient to maintain the melted polymer dispersed in the interstices between the filler material particles with a high degree of uniformity.

Also in accordance with the invention there are provided highly filled composite materials comprising finely powdered filler material particles distributed in a matrix of polymer material with a high degree of uniformity, the materials comprising;

a composite mixture of 60 to 97 by volume percent of filler material particles and the balance polymer, consisting of a polymer that is soluble in a volatizable solvent that has been volatilized from the mixture, the polymer having sufficient strength and being sufficiently adhesive to the filler material particles to result in composites of bending strength not less than 17 Mpa (2,500 psi);

wherein the composite mixture has been subjected to a temperature sufficient to melt the polymer and to a pressure sufficient to disperse the melted polymer into the interstices between the filler material particles to a high degree of uniformity.

BRIEF DESCRIPTION OF THE DRAWINGS

Methods and apparatus for the production of the new composite materials, new composite materials, and articles made of such new composite materials, produced using such methods and apparatus, that are particular preferred embodiments of the invention, will now be described, by way of example, with reference to the accompanying diagrammatic drawings wherein:

FIG. 2 is side elevation of a mixer/solvent evaporation mill shown in outline in FIG. 1;

FIG. 3 is a cross-section through the mill of FIG. 2, taken on the line A—A therein;

FIG. 4 is another part of the block flow diagram, continuing from FIG. 1;

DETAILED DESCRIPTION OF THE PREFERRED EMBODIMENTS

Figure 1:
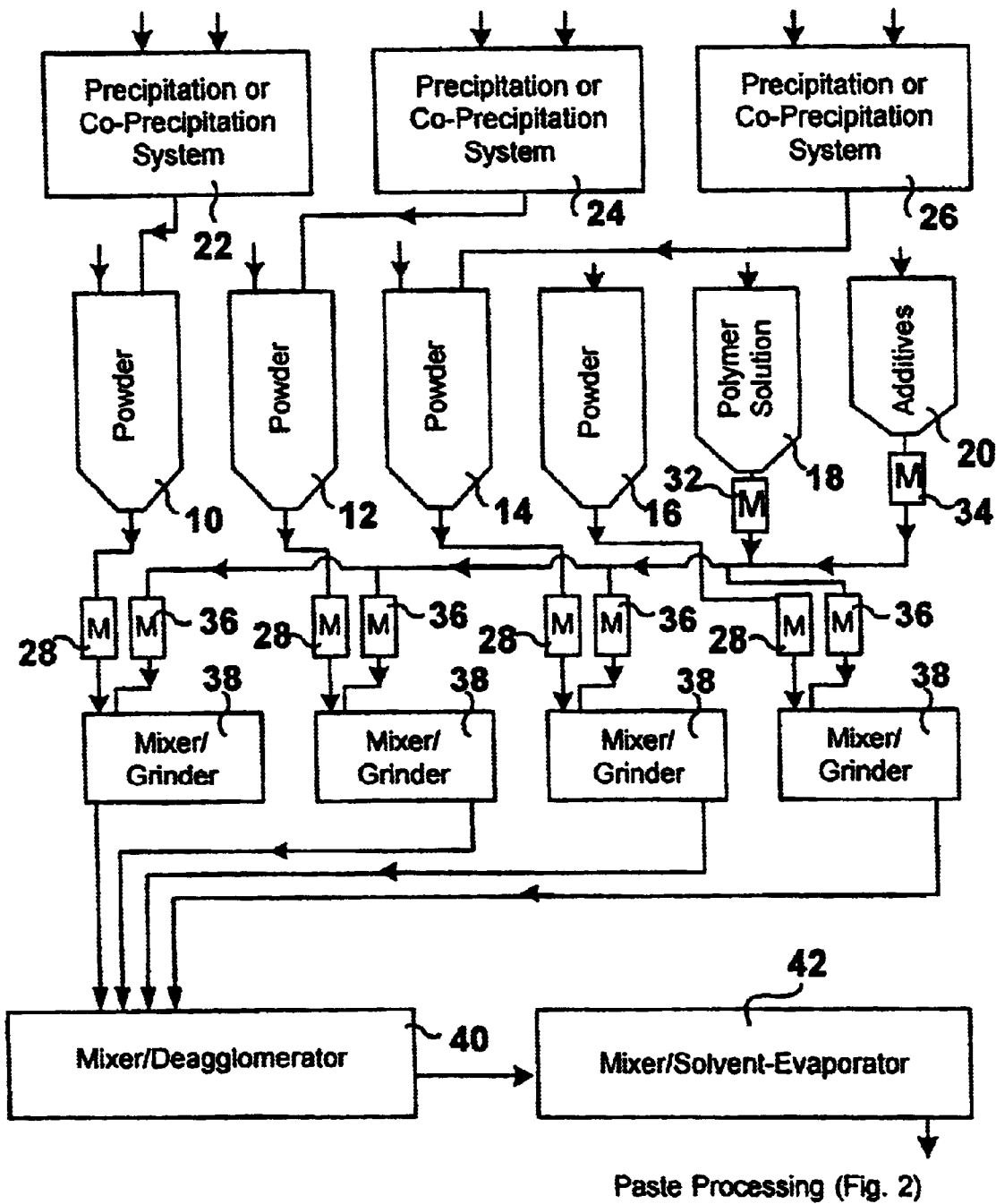
FIG. 1 is the first part of a block flow diagram of the specific method and apparatus for the manufacture of the composite materials and articles of the invention, particularly for the manufacture of flat rectangular copper clad substrates intended for use for electronic circuits.
Figure 5:
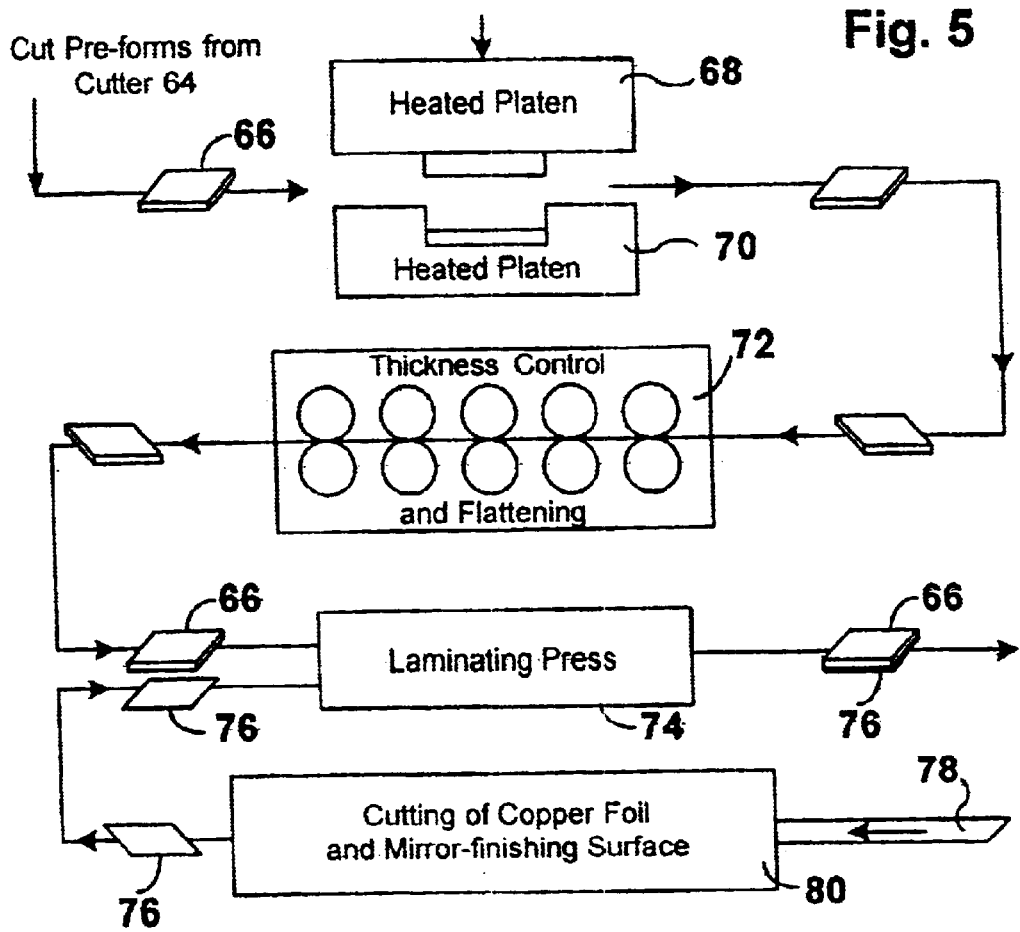
FIG. 5 is a further part of the block flow diagram, continuing from FIG. 4.

I have discovered that unexpectedly the production of useful composite materials with high loadings of finely divided filler materials requires a complete reversal of approach from that which has previously been employed in their production. A major problem in the prior art processes, and in the materials and substrates obtained thereby, is the progressive loss of mechanical strength that results as the filler solids content is increased, and hitherto attempts to incorporate more than about 40 volume percent generally has resulted in composites which are so friable that they literally collapse to a heap of sand-like material if in testing they are stressed to the degree required in commercial practice. Moreover, it has been found difficult with prior art processes even to incorporate as much as 40 volume percent solids material, since as the material is added to the polymer the mixtures become so viscous that uniform mixing becomes virtually impossible. Consequently, the approach has of necessity been to incorporate only as much filler material as will result in a product of adequate mechanical strength, and to accept lower values for the desired other characteristics, such as the electrical characteristics, that result.

With the methods of the invention, for the successful production of composite materials, the solids content must instead be increased to values well beyond those of the conventional prior art. An acceptable minimum for these new composite materials is 60 volume percent. Such materials can be produced to be of the required minimum mechanical strength, it being found unexpectedly that the mechanical strength increases with increased solids content, instead of decreasing, up to the value of about 95–97 volume percent, beyond which value the proportion of polymer is reduced below the minimum required to maintain adequate adhesion of the polymer between the filler particles distributed therein to a high degree of uniformity. It is my belief that a possible explanation for this highly unexpected result, although other explanations may be possible, and therefore I do not intend that the invention be limited thereby, is that even if the chosen polymer is inherently not particularly mechanically strong, a successful composite will be produced if the polymer exhibits sufficient mechanical strength and also sufficiently high adhesion toward the filler material. In the new methods the polymers are employed in the form of very thin adherent layers interposed between the filler particles, such that can only be obtained with the methods of the invention and when the solids content is sufficiently high. It is difficult to specify with any degree of accuracy the optimum thicknesses for the interposed polymer layers; it is known that layers of 1–3 micrometers can be very successful in giving superior adhesion with adequate strength, and a possible upper limit is 40 micrometers (0.001 in).

Composite materials of the invention are made by dissolving the required portion by weight, or by volume, of the chosen polymer material in a solvent in which it is sufficiently soluble that a flowable solution is obtained which can form a homogeneous mixture with the corresponding portion by weight or by volume of the chosen filler material, which should be of sufficiently small dimension, or equivalent spherical diameter, e.g. in the range 0.1 to 50 micrometers. By equivalent spherical diameter is meant the diameter of a completely spherical particle having the same volume as the specified particle. Once such a homogeneous filler/solution mixture has been obtained the solvent, which must be removable, is removed in a manner which does not destroy the homogeneity of the mixture, so that it can then be subjected to a temperature sufficient to melt the polymer material, e.g. in the range 280–400° C. and to a pressure, e.g. in the range 3.5 to 1,380 MPa (500 to 200,000 psi), preferably 70 to 1,380 MPa (10,000 to 200,00 psi), sufficient to disperse the melted polymer material into the interstices between the particles of filler material. Very suitable polymer materials are for example those selected from the group comprising polyarylene ether-2, polyarylene ether-3, and polyarylene ether-4, which materials have been described above and are described in more detail below, while the filler material is selected from the group comprising particles of inorganic material, particles of electromagnetic material, particles of a core of inorganic material covered with a layer of a metal oxide material, particles of metal material particles of magnetic material, and particles of low dielectric constant high melting point polymer material, all of which particles may be hollow.

The resultant heated and pressurized composite mixture may be formed into a sheet, film or tape by a thermoplastic extrusion process, onto a surface of which a layer of copper or other suitable conductive metal may be applied, either by sputtering or by direct bonding of a foil under heat and pressure in a vacuum. Alternatively, green "perform" bodies can be cut from sheet or tape before the heat and pressure step, and these green bodies converted to heated and pressed bodies by a thermoplastic compression process, again to a surface of which a layer of a metal such as copper can be applied by sputtering or by direct bonding of copper foil under heat and pressure in a vacuum. The resultant bodies may comprise substrates for electronic circuits or enclosures for electronic circuits or devices, and the methods of the invention will be described in detail below in connection with the manufacture of such thin flat plates. It will be apparent however that they are applicable also to any shape of highly filled composite molded article with which direct production of superior surface finish, highly uniform microstructures, and high dimensional uniformity from finished article to article is desired.

With microelectronic devices, and with the higher frequencies now employed, the problems of adequate uniformity of physical and chemical constitution and physical and electrical properties of the substrates have been exacerbated, and the simple mixing methods that have been used hitherto generally will not provide sufficient uniformity, especially during the unusually difficult step of removing the volatile solvent without damaging or even destroying the homogeneity of the mixture while it is drying, and it usually becomes necessary to employ high shear mixing methods and apparatus, as described in detail below.

Referring now to FIG. 1, the apparatus to be employed for this particular process permits a mixture of different filler materials to be used, thus providing the opportunity of specifically tailoring the mechanical and electrical characteristics of the resultant substrates for the end product. The polymer is added in the form of a solution thereof, usually of about 5–40% concentration depending upon the solubility of the chosen polymer in the preferred solvent. A suitable solvent for the polyarylene ether polymers is cyclohexanone, which is commercially readily available and is capable of being economically and safely volatilized from the solution after mixing with the filler material. This solvent is also very suitable for use as a liquid dispersion and suspension vehicle for the filler materials and the opportunity is therefore taken of employing it as such. The solution must be sufficiently fluid for the subsequent mixing with the filler material and should therefore be at least of "syrupy" consistency. With this apparatus separate preliminary mixtures are first formed of each of the selected finely powdered filler materials, usually inorganic materials, with respective portions of the polymer solution, the separate mixtures then being combined into one. The filler material or mixture of materials may be obtained respectively by precipitation or coprecipitation from solutions of suitable precursors, and however obtained should have the required purity, dielectric constant, loss tangent, and particle size distribution. In this embodiment up to four different powdered materials can be fed from a delivery and metering system comprising a plurality of hoppers 10, 12, 14 and 16 respectively, while the polymer solution is fed from its hopper 18, and suitable surface active functional additives, if required, such as surfactants, plasticizers and lubricants, are fed from a respective hopper 20. It is an unexpected advantage of the processes of the invention that, usually, such additives are not required and therefore would only be used if absolutely necessary, and then in minimum quantity. The use and function of such materials is well documented, and is also well known to those skilled in this particular art, so that further description is not required.

Each powdered material can be fed directly into the respective hopper 10, 12, 14, and 16, or alternatively obtained from respective precipitation or coprecipitation systems 22, 24, or 26 (a coprecipitation system for the contents of the hopper 16 is not shown. The flow of each filler powder from its hopper is continuously precision metered by a respective meter 28, that of the polymer solution is metered by meter 32, that of the surface active additives is metered by meter 34, and those of the combined polymer solution/filler or additive flows are metered by respective meters 36. Each preliminary mixture of polymer solution, powders and additives is delivered into a respective drum-type high shear mixer/grinding mill 38, described in more detail below.

One of the aspects of the invention that also distinguishes it from prior art processes is that it is preferred to use low cost powders of a relatively wide range of particle sizes in order to obtain optimum packing together of the particles, and resultant minimization of the thickness of the interposed polymer layers, as contrasted with the highly uniform size, and consequently expensive, powders which are required, particularly for the production of fired ceramic substrates to achieve adequate uniformity of processing. Prior to the formation of each mixture the respective powder particles usually consist of particles of a range of sizes, together with agglomerates of many finer particles that inevitably form during storage etc., and that can vary even more widely in size, and this must be corrected, particularly the reduction of the agglomerates back to their individual particles. Each high shear mixer/mill 38 operates to mix the components and produce complete dispersion of the powdered material in the liquid vehicle, and also as a grinding mill to mill the respective powder particles and agglomerates to a required size distribution to a obtain a required degree of uniformity, but with a distribution that will also result in a minimum pore volume when compacted.

The proportions of the powder and polymer solution from the hoppers are such as to obtain a solids content in the respective preliminary mixture in the range of 40–95% by volume, the quantities of the dispersing vehicle (the solvent in this example) being kept as low as possible, but sufficient for the consistency of the mixture to be kept to that of a relatively wet paste or slurry, to permit its high shear mixing and grinding while flowing sufficiently freely through the relatively narrow processing flow passages of the respective mill 38, and the subsequent machines. A viscosity in the range of about 100–10,000 centipoises will usually be satisfactory. In the methods of the invention preferably such grinding, deagglomeration and dispersion of each preliminary mixture is carried out simultaneously in its respective mill 38, using for this purpose a special high shear mill which is the subject of my U.S. Pat. Nos. 5,279,463, issued Jan. 18, 1994, and 5,538,191, issued Jul. 23, 1996, the disclosures of which are incorporated herein by this reference.

These special mills may be of two major types, in a first of which the mill has two circular coaxial plate members with a processing gap formed between them; the axis of rotation can be vertical or horizontal. It is preferred however to use the second type of mill, which consists of an inner cylindrical member rotatable about a horizontal axis inside a stationary hollow outer cylindrical member, the axes of the two cylinders being slightly displaced so that the facing walls are more closely spaced together at one longitudinal location around their periphery to form, parallel to the axes, what is referred to as a processing or micro gap, and are more widely spaced at the diametrically opposed longitudinal location to form, again parallel to the axes, what is referred to as a complementary or macro gap. The mixture flows through the processing gap producing so-called "supra-Kolmorgoroff" mixing eddies in the portion of the slurry at and close to the macro gap and so-called "sub-Kolmorgoroff" mixing eddies in the micro or processing gap. Ultrasonic transducers may be mounted on the stationary member which apply longitudinal pressure oscillations into the processing gap and reinforce the "sub-Kolmorgoroff" mixing eddies. Such apparatus is capable of processing relatively thick slurries of sub-micrometer particles in minutes that otherwise can take several days in conventional high shear mixers and ball or sand mills.

The mixture of separate preliminary mixtures is formed into a substantially uniform slurry or wet paste by passing them together into a mixer/deagglomeration mill 40, in which the combined mixture is subjected to another high shear grinding, deagglomerating and dispersing operation. The mill 40 is again one of the above-mentioned special mills which are the subject of my Pat. Nos. 5,279,463 and 5,538,191, being also of the type comprising an inner cylindrical member rotatable inside a stationary hollow outer cylindrical member. Although only a single mill 40 is employed in this embodiment, in some processes it may be preferred to employ a chain of two or more such mills depending upon the amount and rate of grinding, deagglomeration and mixing that is required.

The mixed and milled slurry passes from the mill 40 to a high shear mixer/solvent evaporation mill 42 (see FIGS. 2 and 3) which again is of the type comprising an inner cylindrical member 44 rotatable inside a stationary hollow outer cylindrical member 46, the paste being carried on the outer cylindrical surface of the member 44 in the form of a thin film 47. In this mill most of the cyclohexanone solvent is removed while the paste is vigorously mixed under high shear conditions that continuously renews the outer surface to ensure that the thickening material remains homogeneous despite the progressive removal of the solvent, such removal requiring that solvent move from the body interior to its exterior surface from whence it can evaporate. Without such vigorous high shear mixing and surface renewal the mixture would rapidly become more and more inhomogeneous as the solvent escapes from the outer surface. The paste thus becomes continuously thicker as it travels in a helical path from the feed entry point 48 of the evaporation mill to its discharge outlet 50 as more and more solvent is withdrawn through solvent discharge outlet 52, from which it passes to a condenser (not shown) for recovery and reuse. At some stage in the volatilization and solvent removal the mixture may now be regarded as having changed phase, so that it no longer comprises filler material substantially uniformly distributed in solution, but instead comprises essentially filler material in which the remaining solution is distributed to a high degree of uniformity. The evaporation of the solvent is facilitated by heat from a row of cartridge heaters 54 in the base of the machine, their output being such as to obtain a temperature in the mixture body of about 150° C.

Near to the discharge outlet 50 the paste is of sufficient stiffness that it can be extruded into a coherent thin tape 56 (or sheet or strip depending upon what is required for the final product) of the desired dimension in thickness and width using a conventional paste extruding machine 58. Since this tape still contains small amounts of solvent, and possibly some residual additives, it must be subjected to a further heating, drying process. The thickness of the tape, etc. exiting from the extruder will depend to some extent on the thickness of the final substrates, but should be as thin as possible in order to facilitate this stage of the evaporation, without disturbing the distribution of the polymer over the particle surfaces. Thus, preferably the tape is less than about 3 mm (0.125 in) in thickness, more preferably less than about 1 mm (0.04 in), and if possible less than 0.5 mm (0.02 in); it will be seen that a wide tape will allow adequate output to be obtained with such thin tapes. Owing to the thinness of the tape the solvent escapes easily and rapidly from the two opposed larger surfaces without any substantial change in homogeneity of the ongoing tape. The simplest equipment for this purpose is a tunnel dryer oven, and to this end the tape is deposited on an endless conveyor 60, which passes it through a drying oven 62, during which passage the solvent and as much as possible of the additives are removed to leave the strip or tape consisting only of a thoroughly dispersed composite mixture of the filler material and polymer. A suitable temperature for such an oven is, for example, in the range 150–250° C., the heating being carried out slowly to avoid as far as possible the formation of bubble holes by the exiting solvent, and by any additives or additive breakdown products that may be present.

The tape 56 of dried paste is passed through a cutting station 64, in which it is severed into individual "green" substrate preforms 66, usually of rectangular shape and of the size required for the electronic circuit board substrate, if that is the use for which the materials are intended. The preforms are deposited manually or automatically into the cavity of a heated compression mold comprising heated upper and lower platens 68 and 70, the cavity being located in the lower heated platen 70 to facilitate the loading process. Once the preform is loaded the mold cavity is closed by the downward moving heated top platen 68 which protrudes into the cavity to compress the preform to its required dimensions and density. If desired a final volatilization and degassing can take place by applying a vacuum to the interior of the mold as and after it is closed. The temperature to which the preforms are heated in the mold is sufficient to melt the polymer so that it will flow freely under the pressure applied to completely fill the interstices and coat the filler material particles, while the maximum is that at which the polymer will begin to degrade unacceptably. The minimum pressure to be employed is coupled with the choice of temperature, in that it must be sufficient for the melted polymer to flow as described, the pressure and time for which the mold is closed being sufficient for the material of the preforms to attain maximum compaction and density. During the heat and pressure cycle the melted polymer will flow relatively freely and the temperature and pressure are maintained for a period sufficient to ensure that the polymer can completely fill the relatively small interstices between the solid particles in the form of correspondingly very thin layers. Typically the temperature is in the range 280–400° C., while the pressure is in the range 70 MPa to 1,380 MPa (10,150 to 200,000 psi), although a more commercially likely pressure is about 345 MPa (50,000 psi), while pressures as low as 3.5 MPa (500 psi) may be usable. The surfaces of the platens that contact the preforms are mirror-finished or better to assist in obtaining the smooth surfaces that are desired for electronic substrates intended for microwave frequency applications.

The substrates 66 issuing from the press are fed to a multi-stand, heated, flattening roller mill 72 in which they are rolled to an accurately controlled thickness and flattened. The surfaces of these rolls are also mirror-finished, or better, again in order to obtain the desired final smooth surfaces. The sheet, film or tape from which the preforms have been cut usually has a thickness less than about 60 mil, can be less than about 30 mil, may be less than about 10 mil, may be less than about 4 mil, and can even be less than about 1 mil. Substrates intended for use in electronic circuits will usually be of thickness in the range 0.125 mm to 1.5 mm (5–60 mil), and if intended for thick film usage are usually required to be smooth to about 0.75–0.90 micrometer (22–40 microins), while if intended for thin film usage must be flat to better than 0.05 micrometer (2 microins). The preforms are now fed to a heated laminating press 74 in which they are each laminated on one or both sides with a thin flat smooth piece 76 of conductive metal, usually copper sheet, of the same size, which subsequently is etched to produce the electric circuit. These sheet copper pieces are obtained by cutting from a strip 78 supplied from a roll thereof (not shown) which is cut into pieces at a cutting and mirror-finish surfacing station 80. The surfacing means comprises a hot press in which the cut pieces are pressed between a pair of heated platens, the platen surfaces being mirror-finished or better so that a corresponding finish is imparted to the surfaces of the pieces. The mirror-finishing of the substrate surfaces and those of the copper pieces is especially important in ultrahigh-frequency applications since, as described above, the currents tend to flow only in the surface layers of the conductors, and a high degree of uniformity in characteristics of the etched conductors is facilitated by such smooth surfaces.

With the methods of the invention the volume percentage of the filler material can be 60% or more, the minimum value being that at which the interposed films or layers of polymer are somewhat too thick to have the required mechanical strength for the substrate to have the corresponding minimum amount of flexural strength, namely at least 17 Mpa (2,500 psi). The maximum volume percent is set by the amount of the particular polymer required to adequately bind the particular filler material to form a strong coherent body. Thus, they enable the production of composite materials in which the solids content is easily and economically in the range 60%–97% by volume, preferably 70%–97% by volume. The volume fraction of the polymer in the mixtures is only that needed to adhere the filler material particles together while filling the pores left in the inorganic powder after its compression to minimum pore, preferably pore-free, high density. The relatively small amounts of polymer present in the composite materials must be extremely well and evenly dispersed among the fine particles, and this is readily achievable with the methods employed virtually independently of the particle size of the filler material.

The process and apparatus described above are particularly suited for high volume production of composite materials, but simpler processes requiring less apparatus are also within the scope of the invention. For example, as described above, it is also possible to mix together the finely divided filler material, the polymer, the solvent, and any necessary additives, and thereafter rely upon high shear processing in one or a series of high shear mixer/mills 38 and/or 40 to produce the required thorough dispersion, while at the same time obtaining the preferred range of particle sizes, the dispersed mixture that is produced thereafter being passed to the mixer/solvent evaporator 42, the paste extruder 58 or its functional equivalent, and the drying oven 46 etc., as with the prior process.

For many applications the degree of uniformity required in the material of the finished substrate is such that even the extensive specific process described above may not be sufficient, and it may be necessary to apply an additional series of steps in which the tape 56 or the substrates 66 are broken and shredded or ground back down to about the original particle size distribution, with the difference that the filler material particles are now thoroughly coated with thin coatings of the polymer. This finely divided material is again ground and dispersed in a suitable dispersing medium by use of one or a chain of the special high shear mills, such as the mills 38 and 40 described above, until the maximum possible uniformity is obtained, when the dispersion medium is removed and the resultant material again subjected to a heating and pressing operation to produce the desired substrates, the polymer being sufficiently thermoplastic for this to be possible.

Figure 6:
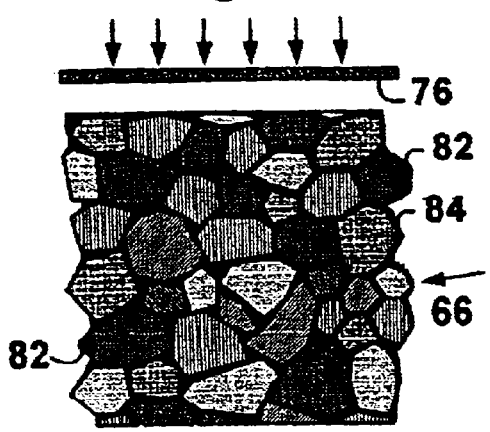
FIGS. 6 and 7 are respective part cross sections to a greatly enlarged scale through a small piece of a typical material of the invention in order to show the grain structure thereof, and showing respectively a layer of metal in position to be applied to a surface, and applied to the surface.
Figure 7:
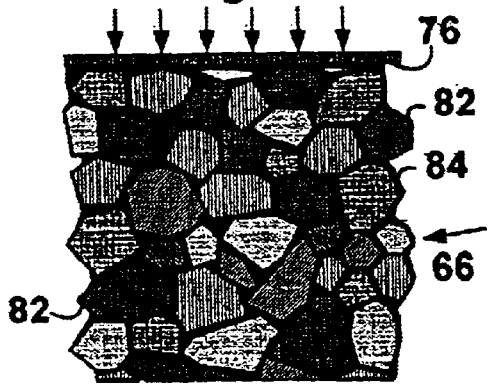

FIGS. 6 and 7 are respective photo micrograph cross sections through a material of the invention, respectively before and after the mirror finished piece 76 of copper sheet is attached to the mirror-finished surface of the substrate, the material consisting of closely packed particles 82 of the filler material, of irregular size and shape, coated and bound together by polymer material 84 that now exists as thin intervening films and interstice-filling masses. As an indication of the size of the particles, etc. involved the square section of FIG. 6 measures 5 micrometers each side. The adhesiveness of the polymers of the invention is sufficient to ensure adequate bonding without the need for reinforcing fibers or fiber-cloth.

As has been set out above, the selection of the polymer or polymer mixture for use in the methods and products of this invention depends, apart from the usual commercial considerations of cost and ready consistent availability, principally upon the availability of a correspondingly readily available solvent that can economically and safely be volatilized back out of the filler/solution mixture, and also upon the polymer or polymers exhibiting sufficient adhesion toward the finely divided filler material to be able to form a composite of the required minimum flexural strength of about 17 MegaPascals (2,500 psi). There is usually no requirement for an upper limit to the flexural strength and values of 124.2 Mpa (18,000 psi) have already been obtained for silica/PAE composites and 144.2 Mpa (20,900 psi) for alumina/PAE composites. For example, many polymers are soluble in mineral oils, which are insufficiently volatile under the maximum heating conditions to which the mixtures can be subjected without serious degradation of the polymer mechanical properties. A very desirable filler material for electronic applications is boron nitride, but this is so difficult to bond to that it is commonly used as a mold release agent, and it is correspondingly difficult to find suitable polymer/solvent combinations for use with it.

Again, as has been described above, a particular currently preferred group is the selected polyarylene-ether polymers, especially those intended for the relatively high temperatures required in electronic applications, because of, for example, the need to solder connections to the electrical elements. Those in which the repeating unit is biphenyl diradical linked with the 4,4'-diradical of 9,9-diphenylfluorene, are designated PAE-2, while another currently preferred group, in which the repeating unit is para-terphenyl diradical linked with the 4,4'-diradical of 9,9-diphenylfluorene, are designated PAE-3, and third currently preferred group, in which the repeating unit is a combination of the units of PAE-2 and PAE-3, are designated PAE-4. All of these polymers investigated so far are sufficiently soluble in cyclohexanone, which is a commercially available and relatively easily handled solvent material. Methods for the production of these polymers are disclosed in the above-mentioned U.S. Pat. Nos. 5,658,994 and 5,874,516, to which reference may be made, and the principal characteristics thereof which are of interest in the implementation this invention are set out in my earlier application Ser. No. 09/345,813, to which reference should be made in the interest of avoiding unnecessary repetition.

There are a multitude of other products that can be produced by use of the methods and materials of the invention in which there is no need to withstand high temperatures and/or there is no need for special electrical characteristics for the filler and/or the polymer. In such cases there are families of polymers that can be used, provided the essential criteria of solubility and flexural strength can be met by the selected family member. A comprehensive listing of such polymers with details of their main parameters and possible solvents is given, for example, in the publication "POLYMER HANDBOOK (Fourth Edition)/Editors: J. Brandup, E. H. Immergut and E. A. Grulke, published 1999 by John Wiley & Sons, Inc, the disclosure of which is incorporated herein by this reference. Details of solvents for various polymer families are given in Chapter VII, pages 498 through 536, such as benzene, toluene, chloroform, etc. for the polydienes; acetone, methanol, etc. for the polyacetylenes; halogenated hydrocarbons, xylene, etc. for the polyalkenes; alcohols, acetone, isporopanol, etc for the polyacrylics; acetone, chlorobenzene, chloroform, etc. for the polymethacrylics; cyclohexane and cyclohexanol, etc. for the polyvinylethers; acetamide, acetone, cyclohexanone, etc. for the polyvinyl alcohols; acetone, benzyl acetate, etc. for the polyacetals; acetone, chloroform, etc. for the polyvinyl ketones; acetic anhydride, DMSO, etc. for the polyvinyl nitrites; and acetic acid, acetone, methanol, etc. for the polyvinyl esters.

The relative proportions of the filler materials and of the polymer depend at least to some extent upon the use to which the substrate is to be put. If a very high frequency circuit is to be installed then it will be preferred to have the maximum amount of filler dielectric material and the minimum amount of polymer. As has been described above, the minimum amount of polymer is set by that required to fill the intergrain interstices when the interstitial volume is at its minimum value, and to ensure sufficient coating of the grains for the resulting composite to have the required mechanical flexural strength. For this reason the composites usually require a minimum of 3% by volume of polymer to be present as long as the optimum particle packing of the filler material has been obtained, the remaining 97% solids content comprising the filler dielectric material, residual surface active and coupling agents if any, and organic or inorganic reinforcing, strength-providing fibers and whiskers, when these are provided. Filler materials of relatively small particle size are preferred, the preferred particle size range being from 0.01 to 50 micrometers. As described above, the presence of particles of filler material of a range comprising different sizes is preferred, since this improves the capability of dense packing in a manner that reduces the interstitial volume, and consequently facilitates the production of the very thin highly adhesive layers that are characteristic of the invention, besides reducing the amount of polymer required to fill the interstices and adhere the particles together. It can be shown theoretically that the minimum interstitial volume that can be obtained when packing spheres of uniform size is about 45%. Owing to the wider particle size distribution that can be employed, this volume can be reduced considerably further, down to the specified value of about 3%.

In addition to the basic characteristic of flexural strength there are a number of commercially important parameters for the substrates, which need to be considered in making a selection of the fillers and polymer/solvent combinations to be used. Among those which require the highest possible values are tensile strength; peel strength; solder joint reliability; compliance i.e. low modulus; plated through hole reliability; dielectric constant; chemical inertness; dimensional stability and Q factor. Among those which require the lowest possible values are water absorption; crosstalk v line spacing; and loss tangent or dissipation factor (reciprocal of Q factor).

The methods of this invention are particularly applicable to the production of composite materials in which the finely powdered filler material consists of any one or a mixture of the "advanced" materials that are now used in industry for the production of fired ceramic substrates for electronic circuits, the most common of which are aluminium nitride; barium titanate; barium-neodymium titanate; barium copper tungstate; lead titanate; lead magnesium niobate; lead zinc niobate; lead iron niobate; lead iron tungstate; strontium titanate; zirconium tungstate; the chemical and/or physical equivalents of any of the foregoing; alumina; fused quartz, boron nitride; metal powders; and semiconductors. Another important group is compositions comprising powdered ferrites and like inductive materials in a polymer matrix have already been produced, used for example in magnetic passive products such as transformers, inductors and ferrite core devices, but the methods used add the powdered filler material into the polymer matrix and their solids contents have generally been limited to not more than about 50% by volume. The invention permits the production of such composite materials of higher solids content, e.g. 80% by volume and above.

At this time the only ceramic materials with temperature stable dielectric constants that are available have values in the ranges 2.6 to 12, 37 to 39 and 80 to 90, whereas in the quickly expanding market of wireless telecommunication, which is based on microwave frequencies ranging from 800 MHz to over 30 GHz, and in which small size and low weight are of increasing importance, the preferred dielectric constant values need to be tailored to be anywhere between 8 and 2000, according to choices dictated by the optimum circuit architecture, instead of, as at present, the circuit architecture being dictated by the very limited ranges of dielectric constants that are available. In microwave or GHz frequencies signal propagation depends mainly on the waveguide character of the circuitry and consequently only such high dielectric constant materials allow significant miniaturization, permitting the use of narrower conductor line widths and shorter lengths. For example, coaxial dielectric resonators, at this time used in more than 25 million cellular telephones worldwide, could be reduced in size and weight by more than half and in cost by more than two thirds if the dielectric constant of the substrate material could be raised from the present value of alumina of about 9 to over 400 and its dielectric loss (loss tangent) kept below 0.0005.

It is possible with these processes to fabricate composite materials in which the powdered filler material is a tailored blend of two or more individual materials. The requirements for substrate materials, especially for very high frequency applications, are very exacting, requiring consideration of a large number of physical properties including filler material content, bulk density (range), surface finish, grain size (average), water absorption(%), flexural strength, modulus of elasticity, coefficient of linear thermal expansion, thermal conductivity, dielectric strength, dielectric constant, dissipation factor, and volume resistivity. The possibility of such blending makes it possible to tailor the properties of the substrates to their specific tasks in a manner which is not possible with a sintered ceramic as in most cases the sintering phase rules would be violated and the resulting fired material would fall apart. One of the main reasons for combining filler materials in any given ratio is to obtain a mixture with a tailored dielectric constant, which constant will remain substantially uniform over a temperature range from say −50° C. to +200° C., and with a very high Q factor (equivalent to a very low loss tangent) desirably above 500 and if possible as high as 5,000.

While the specification describes particular embodiments of the present invention, those of ordinary skill can devise variations of the present invention without departing from the inventive concept.

We claim:

1. A method for the production of highly filled composites of finely powdered filler material particles in a polymer matrix comprising the steps of:

forming a solution of polymer in volatilizable solvent, the polymer being of sufficient strength and sufficiently adhesive to the filler material particles to result in composites of flexural strength not less than 17 MPa (2,500 psi);

mixing together from 60 to 97 by volume percent of filler material particles with sufficient solution to form a suspension having therein the balance in volume percent of the polymer required for the composite;

evaporating solvent from the suspension while subjecting it to high shear treatment so as to maintain distribution of filler particles in the solution, the evaporation being continued until a mixture is obtained consisting essentially of filler particles with the residual solution distributed therein, the evaporation being further continued until the solvent has substantially entirely been removed; and subjecting the mixture to a temperature sufficient to melt the polymer and to a pressure sufficient to maintain the melted polymer dispersed in the interstices between the filler material particles.

2. A method as claimed in claim 1, wherein the polymer material is selected from the group consisting of polyarylene ether-2, polyarylene ether-3, and polyarylene ether-4, and wherein the solvent is cyclohexanone.

3. A method as claimed in claim 1, wherein the filler material is selected from the group consisting of particles of inorganic material, particles of electromagnetic material, particles of a core of inorganic material covered with a layer of a metal oxide material, particles of metal material, particles of magnetic material, and particles of low dielectric constant high melting point polymer material, all of which particles may be hollow.

4. A method as claimed in claim 1, wherein the composite mixture is heated to a temperature in the range 280–400° C. and to a pressure in the range 3.5 to 1.380 MPa (500 to 200,000 psi).

5. A method as claimed in claim 1, comprising also the steps of:

evaporating the solvent from the suspension with maintenance of substantial uniformity of distribution of the filler material particles in the polymer solution in a high shear mixer/evaporator to form an extrudable mixture;

extruding the extrudable mixture in the form of a thin strip, ribbon or sheet;

heating the extruded strip, ribbon or sheet in a drying furnace to remove residual solvent therefrom; and subjecting the dried strip, ribbon or sheet to the specified temperature and pressure.

6. A method as claimed in claim 5, wherein the solvent is evaporated from the suspension with maintenance of substantial uniformity of distribution in a high shear mixer as disclosed in U.S. Pat. Nos. 5,279,463 and 5,538,191.

7. A method as claimed in claim 1, wherein the filler material particles are of size in the range 0.1 to 50 micrometers and consist of a mixture of filler materials of different chemical compositions.

8. A method as claimed in claim 1, and including the steps of forming the heated and pressurized composite mixture into a sheet, film or tape, and thereafter applying a layer of a conductive metal for the formation of conductors to a surface of the sheet, film or tape by a process selected from sputtering and direct bonding of foil under heat and pressure in a vacuum.

9. A method as claimed in claim 8, wherein the sheet, film or tape has a thickness less than about 60 mil.

10. A method as claimed in claim 1, and including the step of forming substrates for electronic circuits from the heated and pressurized composite mixture.

11. A method as claimed in claim 1, and including the step of enclosing electronic circuits or devices with the heated and pressurized composite mixture.

12. A method as claimed in claim 1, wherein in the step of evaporating solvent from the suspension the distribution of filler particles in the solution is substantially uniform and the residual solution is distributed substantially uniformly, and wherein in the step of subjecting the mixture to a temperature the melted polymer material is substantially uniformly dispersed in said interstices.

* * * * *